United States Patent [19]

Simon et al.

[11] 4,377,049
[45] Mar. 22, 1983

[54] CAPACITIVE SWITCHING PANEL

[75] Inventors: Donald R. Simon, Wayne; Robert J. Strowe, Ramsey, both of N.J.

[73] Assignee: PepsiCo Inc., Purchase, N.Y.

[21] Appl. No.: 152,523

[22] Filed: May 22, 1980

[51] Int. Cl.³ ................ G09F 11/00; H01H 9/00; G08C 9/00; G07F 11/00
[52] U.S. Cl. .................... 40/465; 40/491; 40/16.4; 40/319; 200/DIG. 1; 200/309; 340/365 VL; 434/339; 221/2
[58] Field of Search ........ 340/365 R, 365 C, 365 VL; 40/491, 465, 553, 574, 575, 16, 16.4, 10, 337, 336, 319; 200/5 A, DIG. 1, 309, 312, 313; 434/339, 335; 221/5, 2, 8

[56] References Cited

U.S. PATENT DOCUMENTS

| 3,244,369 | 4/1966 | Nassimbene | 340/365 C X |
|-----------|--------|------------|-------------|
| 3,757,322 | 9/1973 | Barkan et al. | 434/335 X |
| 3,760,360 | 9/1973 | Reynolds et al. | 340/365 R X |
| 3,777,222 | 12/1973 | Harris | 340/365 R X |
| 4,056,699 | 11/1977 | Jordan | 200/5 A |
| 4,060,703 | 11/1977 | Everett, Jr. | 200/3 B X |
| 4,121,204 | 10/1978 | Welch et al. | 340/365 C |
| 4,171,584 | 10/1979 | Kaiser | 40/16.4 X |
| 4,218,603 | 8/1980 | Satoh | 340/365 R X |
| 4,250,495 | 2/1981 | Beckerman et al. | 340/365 C |
| 4,257,179 | 3/1981 | Oka et al. | 340/365 VL X |

*Primary Examiner*—Gene Mancene
*Assistant Examiner*—Michael J. Foycik
*Attorney, Agent, or Firm*—Scully, Scott, Murphy & Presser

[57] ABSTRACT

An improved selection panel having a plurality of touch-actuated capacitive switches thereon. Each capacitive switch in the panel includes a transparent glass substrate having transparent conductive coatings on opposite sides thereof to form a capacitor. A display support is positioned behind and adjacent to the plurality of capacitive switches, and provides a separate display card support for each capacitive switch. A removable display card is positioned in each separate support in a manner such that each of the display cards may be changed periodically.

6 Claims, 6 Drawing Figures

CAPACITIVE SWITCHING PANEL

BACKGROUND OF THE INVENTION

1. Field of the Invention

The present invention relates generally to an electronic selection panel having touch-actuated capacitive switches and, more particularly, pertains to a selection panel wherein each capacitive actuated switch is transparent and includes a changeable display card positioned behind the selection panel.

2. Disscussion of the Prior Art

Switching panels are well known in the art for a variety of machines and appliances such as electric ranges, microwave ovens, washing and drying machines, elevators, vending machines, or the like. Known types of switching panels frequently have incorporated therein mechanical pushbutton type switches and, more recently, have utilized touch-actuated capacitive switches which rely not upon a mechanical movement in the switch but rather upon a change of capacitance which is produced when a conductive body such as a users finger is pressed against one plate of the capacitor. Frequently the function of a particular switch is indicated by a permanent indicia, such as a permanent overlay, embossed or engraved markings, provided either directly on the switch face or being closely associated therewith on the switching panel. Unfortunately, the permanent indicia often do not offer a desired flexibility for the switching panel which would allow replacement of the indicia either to indicate a different switch function or to allow the replacement of a particular design or color.

Furthermore, the advent of electronic controls for many appliances has also produced a requirement or need for a simple method of entering information into the controls. Heretofore, a keyboard has fulfilled this function by allowing a user to enter information by depressing a series of push button switches. However, the keyboard is not entirely desirable or suitable in many instances, especially in connection with appliances, because water and other foreign matter can readily collect on the surface of the keyboard as well as enter the interior thereof. In order to overcome problems associated with mechanical keyboards, there have been developed electronic keyboards, sometimes known as "touch plates". A touch plate is generally sectioned off into a plurality of areas, each such area representing certain information which is to be entered into the control by the touching of that particular area.

Jordan U.S. Pat. No. 4,056,699 and Castleberry et al U.S. Pat. No. 4,161,766 each disclose typical touch-actuated capacitive switching panels. Jordan discloses a touch plate assembly having a legend applied over the top electrically conductive coating forming one plate of the parallel plate capacitor switch to indicate the switching function thereof. Castleberry et al. illustrates a typical touch-type capacitive switching pad, but does not particularly specify the nature of the indicia associated with the pad.

Harris U.S. Pat. No. 3,777,222 discloses a modular touch sensitive indicating panel having an overlay which features protectively encapsulated and customized art work of characters therein. The elastic overlay membrane forms a covering surface for the panel with discrete switch sites therein being designated by the integral art work. The touch sensitive switches of this reference are not capacitive type of switches.

Lauren et al. U.S. Pat. No. 3,188,437 discloses a push button signal light switch having a removable indicia element therein. A switch such as an elevator push button switch has a translucent base portion with an associated indicia element. The switch is designed with a removable indicia element to allow the element to be easily replaced by indicia of a variety of designs or colors.

SUMMARY OF THE INVENTION

Accordingly, it is a primary object of the present invention to provide a selection panel having touch actuated capacitive switches while providing for a convenient change of visible indicia indicating the nature of each switching function.

Another object of the present invention is the provision of a selection panel of the type indicated wherein each touch actuated capacitive switch is formed by a transparent substrate having conductive coatings on opposite sides thereof, and the indicia is positioned behind the transparent substrate in a common frame.

In accordance with a preferred embodiment of the present invention, an improved selection panel has at least one touch-actuated capacitive switch, and incorporates the facility to readily change a visible indicia indicative of the nature of the switching function. The touch-actuated capacitive switch is formed by a transparent substrate having first and second transparent conductive coatings on opposite sides thereof, and a suitable frame for the indicia is positioned behind and adjacent to the coated substrate. A removable rectangular paper tab having printed indicia thereon is provided for each capacitive switch, and is positioned in the frame adjacent to the coated substrate such that the indicia is visible therethrough to indicate the nature of the switching function. Furthermore, in accordance with a preferred embodiment, the selection panel has a plurality of capacitive switches, and a suitable tab holder for the tabs is positioned behind the switches. In one embodiment the tab holder comprises a common frame providing opposed U-shaped slots on opposite sides of each capacitive switch, such that each rectangular paper tab is slideable between a pair of opposed slots. In a second embodiment, the tab holders are formed by a ladder of spaced rods attached to the interior surface of the common substrate. Furthermore the plurality of capacitive switches are constructed on one common clear or transparent substrate having a plurality of discrete conductive areas on both sides thereof forming the separate capacitive switches. Also, an opaque delineation pattern may be provided on the substrate to provide a visible separation of the different areas of the different switches while also obscuring the frame from the view of a customer. Moreover, a metal barrier panel may be provided behind the substrate to prevent access to the interior of the machine in the event of breakage of the substrate.

Accordingly, a primary object of the present invention is the provision of a novel selection panel having a plurality of touch-actuated capacitive switches and also providing for the convenient changing of visible indicia associated each switch. Furthermore it is desirable to eliminate many of the mechanical problems associated with present switching panels while also providing a panel in which indicia associated with switches thereon may be readily changed in the field.

BRIEF DESCRIPTION OF THE DRAWINGS

The foregoing and other objects and advantages of a novel capacitive switch selection panel constructed pursuant to the teachings of the present invention may be more readily understood by one skilled in the art having reference to the following detailed description of a preferred embodiment thereof, taken in conjunction with the accompanying drawings wherein identical reference numerals refer to like elements throughout the several views, and in which.

DETAILED DESCRIPTION OF THE DRAWINGS

Figure 1:
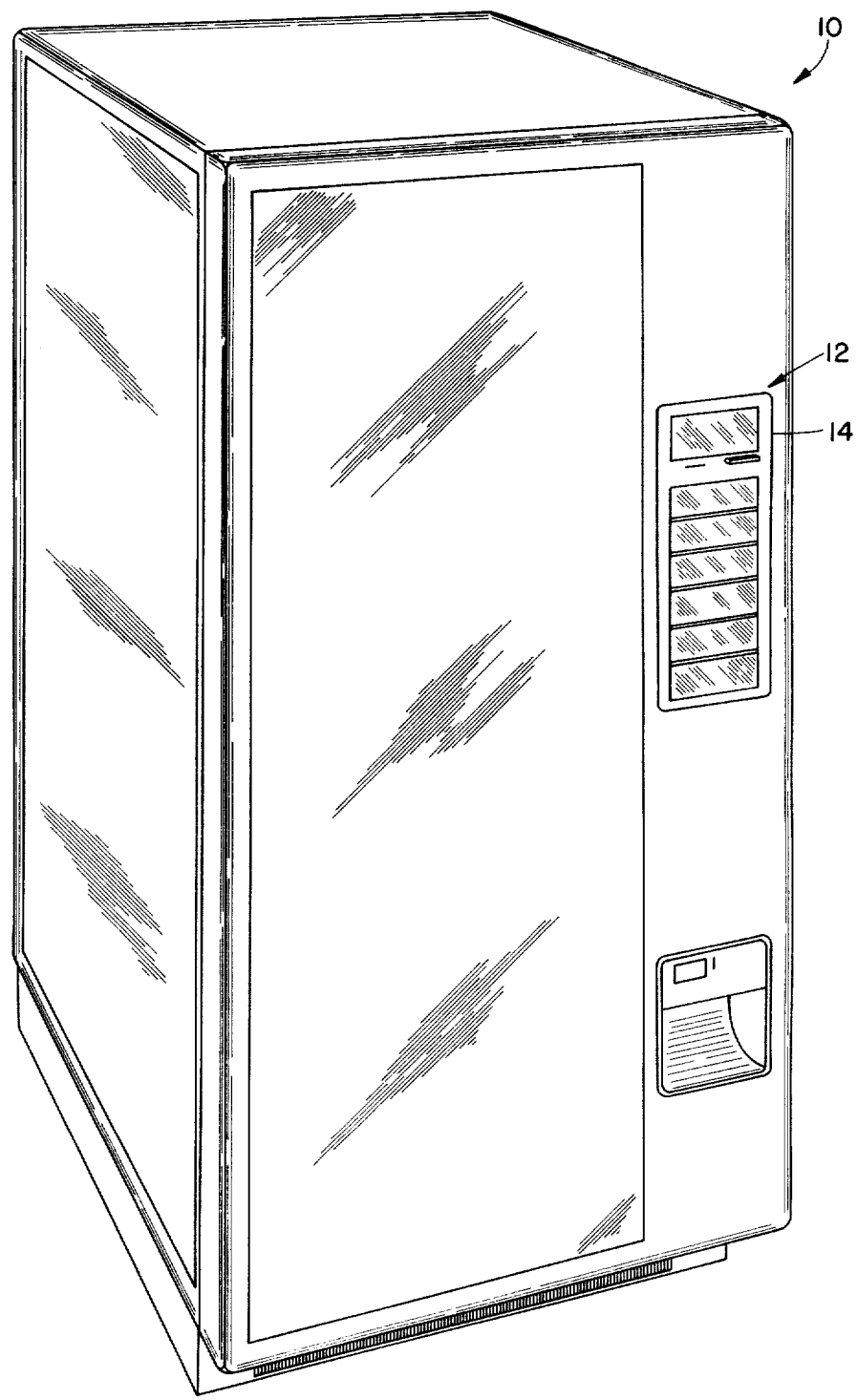
FIG. 1 is a frontal perspective view of a vending machine which incorporates the novel capacitive switching panel of the present invention.

Referring to the drawings in detail, FIG. 1 illustrates a vending machine 10 of the type, for example, which may dispense containers of soft drinks. The vending machine may have the constructed features described in U.S. patent application Ser. No. 112,172, entitled VENDING MACHINE WITH COMMON PANEL STRUCTURE filed Jan. 15, 1980; and further may incorporate security features as taught in U.S. patent application Ser. No. 112,170, entitled SECURITY PYLON FOR A VENDING MACHINE filed Jan. 15, 1980; the applications being assigned to the common assignee for this application. The vending machine includes a selection switching and display panel 12 on its front wall or panel. A vending machine of this type typically provides a plurality of switches to enable a customer to select a particular choice of beverage. However although the present invention is illustrated with regard to the selection panel of a vending machine, it should be appreciated that the teachings herein are applicable to other types of machines and appliances, and can be implemented in elevators and appliances such as microwave ovens, television sets, etc.

Figure 2:
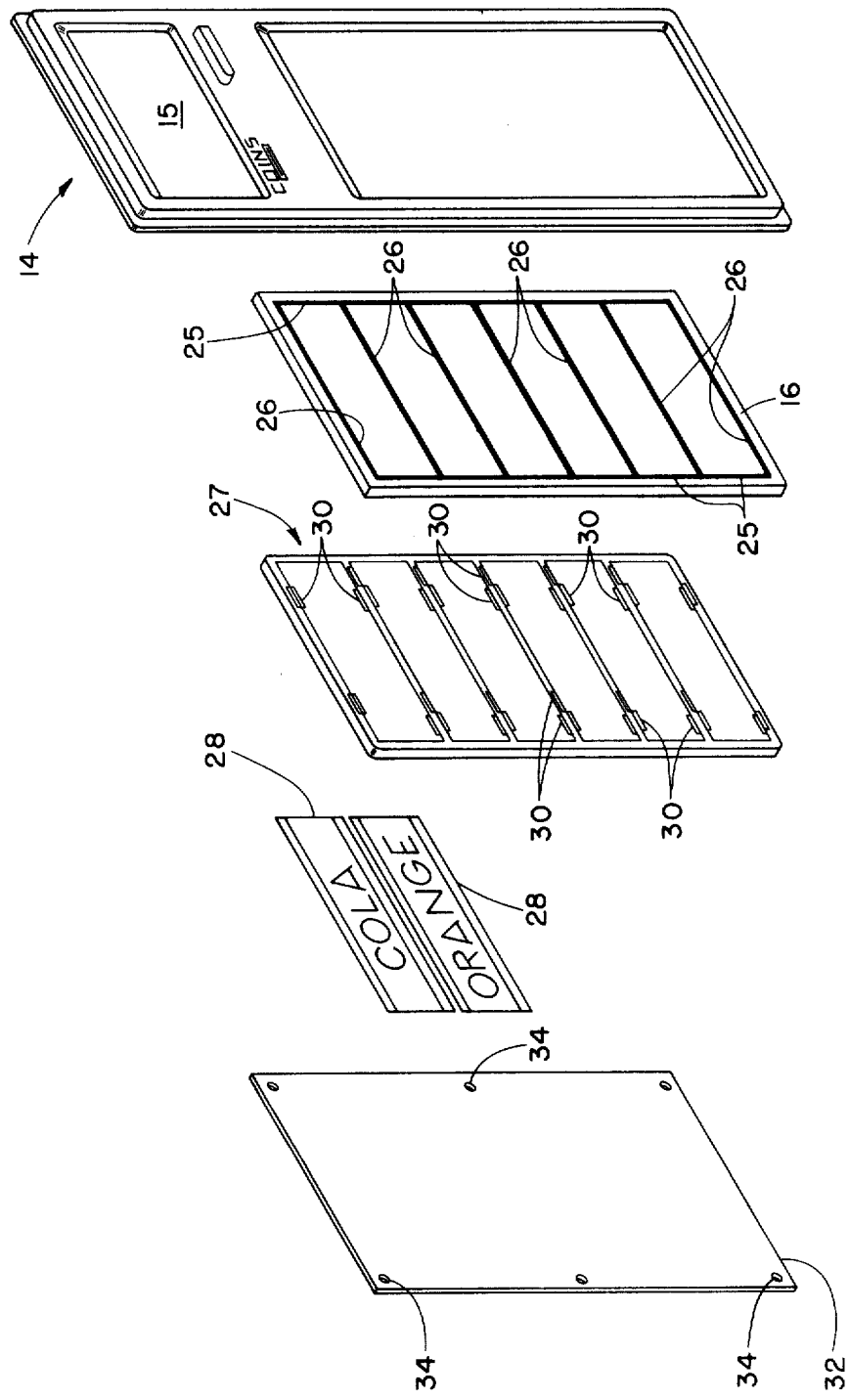
FIG. 2 is an exploded view of a switching panel constructed pursuant to the teachings herein.

FIG. 2 is an exploded view of the improved selection switching panel 12 illustrating the various components thereof. An escutcheon panel 14 is mounted on the exterior face of the dispensing machine, and provides a frame around the various selection switches and displays therein. Normally, the escutcheon panel is constructed of chrome plated metal and is permanently mounted on the front panel of the vending machine by fasteners provided on the interior of the machine. The escutcheon panel has a display area 15 near its top to provide a display of various instructions, legends, amounts, etc. to enable a customer to operate the machine.

Figure 6:
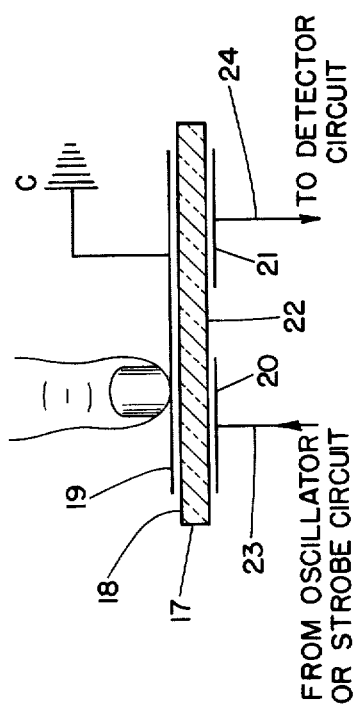
FIG. 6 is a sectional view along line 6—6 in FIG. 5, and illustrates the electrical connections of each capacitive switch.
Figure 4:
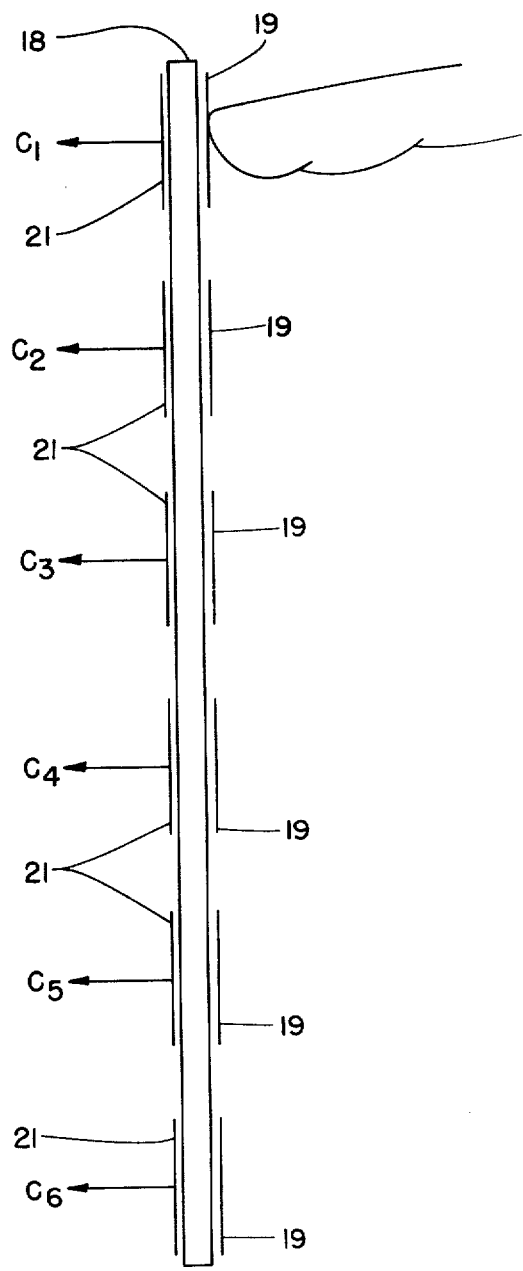
FIG. 4 is a side elevational view of the capacitive switching arrangement.
Figure 5:
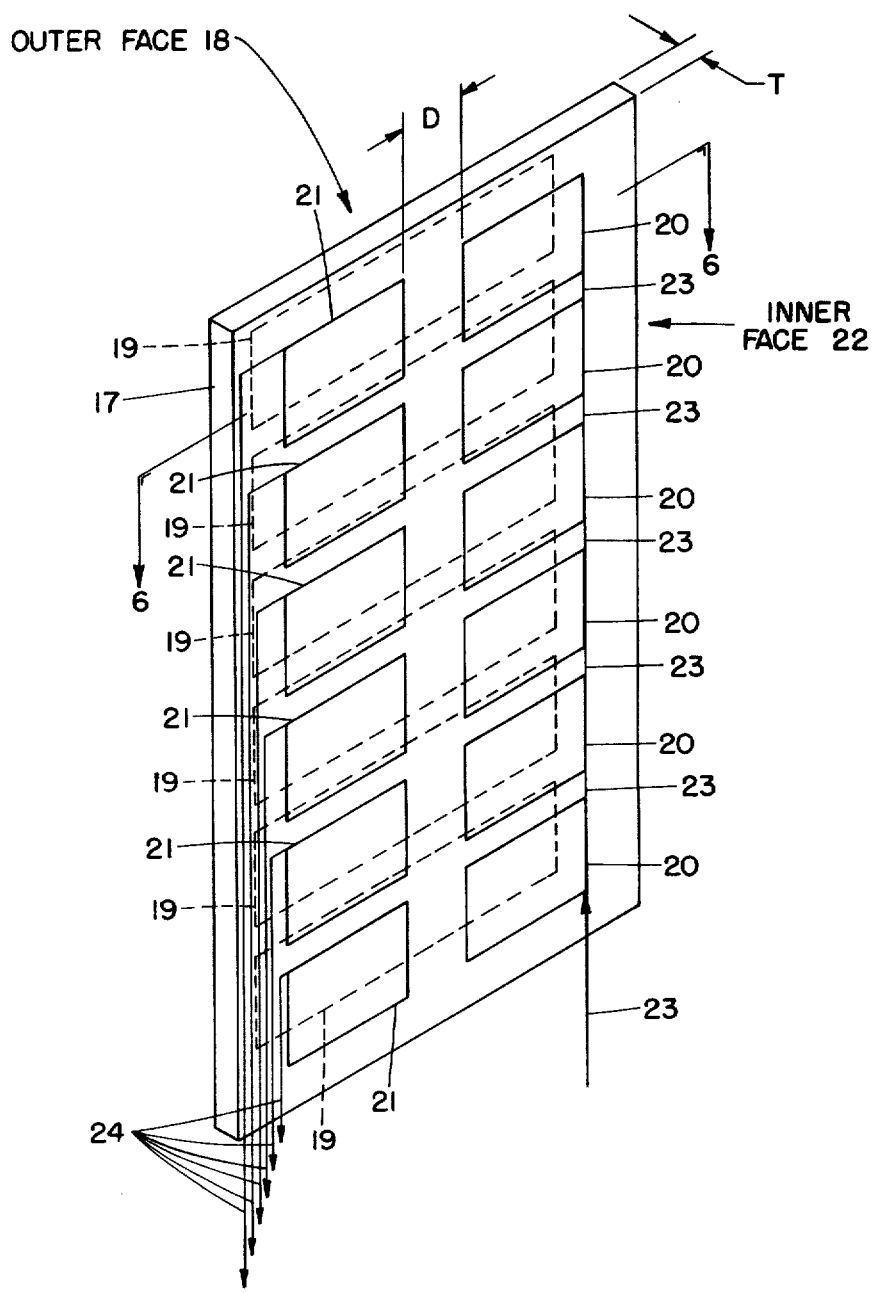
FIG. 5 illustrates a perspective view of the capacitive switching substrate shown in FIG. 4.

A touch sensitive selection switch array 16 is permanently mounted directly behind the escutcheon panel. Referring specifically to FIGS. 4, 5 and 6, the capacitive switch arrangement comprises a dielectric substrate 17, upon a front, or outwardly-facing, surface 18 on which are fabricated touch electrodes 19 of transparent conductive or semiconductive material, each having a preselected boundary, herein illustrated as being of retangular shape. A pair of electrodes 20 and 21, commonly referred to respectively as a transmitting electrode and a receiving electrode are fabricated of a transparent conductive or semiconductive material upon the remaining, inwardly-facing surface 22 of the substrate opposite each touch electrode 19. Both transmitting and receiving electrodes 20 and 21 are typically of substantially smaller area than, and are positioned substantailly within the boundaries of, the area of touch electrode 19. The closest points between transmitting and receiving electrodes 20 and 21 are separated by a preselected distance D, while each of electrodes 20 and 21 are separated from touch electrode 19 by a preselected dielectric thickness T, derived in accordance with the insulation characteristics to be achieved. Each of transmitting and receiving electrodes 20 and 21 have an associated conductive lead wire 23 and 24, respectively, coupled to a point thereon for connection of the touch-pad to known circuitry (not shown for purposes of simplicity) configured to drive the transmitting electrode with a periodically-varying waveform and to recognize a change in the peak amplitude of that waveform at the receiving electrode as the effective series coupling impedance between transmitting and receiving electrodes varies when touch electrode 19 is approached and/or contacted.

A delineation pattern is also provided on the interior or back face 22 of the substrate, and includes two dark, vertically extending lines 25 indicating the sides of the switches and plurality of dark, horizontally extending lines 26 separating each of the rectangular switch areas. The delineation pattern indicates the area of each switch to customers, and in one embodiment also blocks a common frame 27 from the view of customers, enabling only indicia cards 28 held by the frame to be seen. The delineation pattern may be simply a painted pattern on the substrate, or may be formed by etching or some other suitable manner of marking.

The overall arrangement provides a number of discrete parallel plate capacitors which are connected to suitable circuits to sense changes in their capacitive values. When a further conductive body such as the human body is added to one of the plates of a capacitor (as by pressing the exterior plate of the capacitor with a finger as illustrated in FIG. 6), the added conductive body alters the capacitance of the parallel plate capacitor. This alteration in capacitance may be detected by an appropriate circuit in the vending machine. The circuit then triggers the machine to perform the switching function as by dispensng a container of the selected soft drink. In one known sensing circuit, an oscillator and a level detector are connected respectively to the conductive areas of the capacitor. When the capacitive switch is untouched the level detector provides a high or logic level 1 output. When the capacitive switch is touched, additional capacitance is introduced into the circuit between ground and the parallel plate capacitor. The additional capacitance significantly attenuatas the input to the level detector from the oscillator, producing a low or logic level 0 output from the detector. A separate level detector is provided for each capacitive switch on the panel. Preferably, a single oscillator circuit is provided for the entire panel, and is connected to all of the capacitive switches. The circuit detecting a change in capacitance in a touch actuated switch may incorporate a suitable time delay, such as a one half to one second delay, to prevent actuation of the vending machine unless a customer maintains his finger in contact with the capacitive switch for a selected length of time.

In a first embodiment of the present invention, a thin common metal frame 27 forms a holder for the indicia cards 28, and is positioned immediately behind the capacitive glass substrate 17. The metal frame 27 is designed to support the selection cards indicating the selection which is available through each capacitive switch. The metal frame 27 includes a number of smaller rectangular metal frames, one for each indicia card. Each smaller rectangular frame has top and bottom channel frame members which are provided with opposed tabs 30 on each side of an indicia card, and functionally form a U-shaped frame member with the open end of the U being in the direction of the interior of the frame. In effect the tabs form a U-shaped slot on the top and bottom of each indicia card, with the arrangement being suitable for cooperation with a flexible indicia card. In practice, the indicia card is bent at its middle to temporarily decrease its width, and is then inserted between the tabs in the top and bottom frame members. It is then released to expand to its full width, and is securely held in position by the channel frame members. Each indicia card indicates the nature of the function of particular switch, and is clearly visible to a customer through the transparent conductive coatings and glass substrate.

In one embodiment of the present invention the capacitive switch substrate is formed of glass, and accordingly presents the possibility of being broken, either accidentally or by vandalism. In view thereof, a metal barrier panel 32 may be provided behind the glass substrate. The barrier panel is attached to the front panel of the machine as by screws through spaced holes 34, and prevents access to the interior of the machine in the event the glass substrate is broken. The indicia cards may be readily changed at any time by service personnel by merely opening the machine, removing the metal barrier panel, bending and removing the indicia cards to be changed, and bending and inserting new indicia cards in their place.

The indicia or selection cards may be formed of a suitable stiff paper product, such as a relatively thin cardboard having imprinted thereon the legend or trademark of the particular selection being offered by the vending machine.

Figure 3:
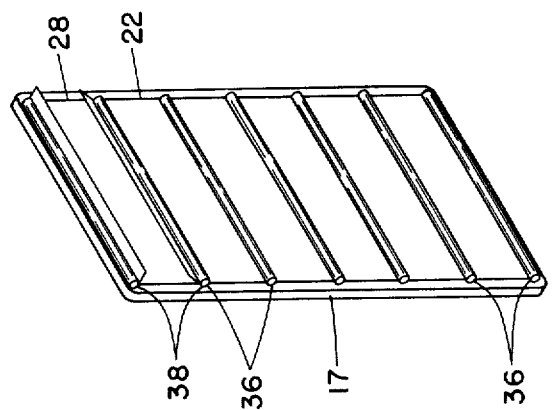
FIG. 3 is a perspective view of a second embodiment of a suitable tab holder for the paper tabs bearing the legends of the switching functions.

In a second preferred embodiment of the present invention illustrated in FIG. 3, a holder for the indicia cards 28 is formed directly on the inner face 22 of the substrate 17 by a plurality of horizontally positioned rods 36 attached to the substrate generally behind the horizontally extending delineation lines 26. The rods 36 extend across the full width of the substrate, and a paper card 28, creased at its edges along lines 38, is inserted between the rods along the substrate inner face 22. In this embodiment the rods are placed along the inner face 22 in a ladder-like array, and may be secured in position by a suitable adhesive or glue.

Although the detailed embodiment is explained with reference to a vending machine, the teachings herein can be used with any other type of selection panel incorporating a plurality of capacitive switches therein, particularly in offering different style or color indicia.

Although one embodiment has been described in detail, it should be apparent that many variations and different embodiments will be suggested by the disclosure and teachings herein to one of ordinary skill in the art.

What is claimed is:

1. An improved selection panel for a vending machine having a plurality of touch-activated capacitive switches and the facility to readily change the visible indicia associated with each switch such that the visible indicia and the product associated therewith can be conveniently changed to change the products vended by the machine, comprising:
   a. a transparent substrate;
   b. first and second transparent conductive coatings on opposite sides of said substrate forming portions of each capacitive switch, with the transparent coatings allowing indicia positioned behind the coated substrate to be visible therethrough;
   c. an opaque delineation pattern for the substrate for separating the different areas of the different capacitive switches;
   d. a frame positioned behind and adjacent to said coated substrate for supporting a plurality of retangular indicia tabs associated with the plurality of switches such that the indicia tabs are supported adjacent to said coated substrate and visible therethrough to indicate the type of product vended by each switch, said frame being substantially coextensive with said delineation pattern such that the lines of the delineation pattern obscure the members of the frame from view, said frame having two frame members on opposite sides of each capacitive switch providing opposed holders for each switch to support a rectangular indicia tab associated therewith such that the indicia associated with each switch is conveniently changeable by replacement of its indicia tab.

2. An improved selection panel as claimed in claim 1, said frame including a ladder-like array of rods positioned adjacent to said substrate, and each said removable indicia being slideable between two adjacent rods.

3. An improved selection panel as claimed in claim 1, said opposed holders comprising opposed U-shaped slots.

4. An improved selection panel as claimed in claim 1, said plurality of switches being vertically places relative to one another.

5. An improved selection panel as claimed in claim 1, each removable indicia tab being a rectangular tab of paper.

6. An improved selection panel as claimed in claim 1 or 2 or 3 or 4 or 5, including a metal barrier panel provided behind the substrate to prevent access to the inside of the machine in the event of breakage of said substrate.

* * * * *